(12) United States Patent
Rockett

(10) Patent No.: US 6,570,227 B2
(45) Date of Patent: May 27, 2003

(54) HIGH-PERFORMANCE HIGH-DENSITY CMOS SRAM CELL

(75) Inventor: Leonard R. Rockett, Washington, DC (US)

(73) Assignee: BAE Systems Information and Electronics Systems Integration, Inc., Rockville, MD (US)

( * ) Notice: Subject to any disclaimer, the term of this patent is extended or adjusted under 35 U.S.C. 154(b) by 0 days.

(21) Appl. No.: 09/911,872

(22) Filed: Jul. 25, 2001

(65) Prior Publication Data

US 2002/0020886 A1 Feb. 21, 2002

Related U.S. Application Data

(63) Continuation-in-part of application No. 09/598,681, filed on Jun. 21, 2000, now Pat. No. 6,429,492.
(60) Provisional application No. 60/220,700, filed on Jul. 25, 2000.

(51) Int. Cl.[7] .............................................. H01L 29/72
(52) U.S. Cl. ..................... 257/367; 257/369; 257/370; 257/371; 257/374
(58) Field of Search ................................ 257/367, 369, 257/370, 371, 374

(56) References Cited

U.S. PATENT DOCUMENTS 4,805,148 A * 2/1989 Diehl-Nagle ................ 257/369
5,536,960 A * 7/1996 Hayashi ....................... 257/369

* cited by examiner

Primary Examiner—Edward Wojciechowicz
(74) Attorney, Agent, or Firm—Wallace G. Walter

(57) ABSTRACT

A high-performance high-density CMOS SRAM cell (MC) having first and second cross-coupled inverters each defined by serially connected complementary MOS transistors (TA/TC; TB/TD) serially connected between $V_{dd}$ and circuit ground to form a first inverter with a first data node (1) between the two transistors (TA/TC) of the first inverter, and, in a similar manner, to form a second inverter with a second data node (2) between the two transistors (TB/TD) of the second inverter. The gates of transistors of each inverter are connected together and cross-coupled to the data node of the other inverter. An access transistor (TE) is connected between a bit line (BL) and the first data node (1) to provide data access thereto. A diode (D) is connected between the data node of one of the inverters and the common gate connection of the other inverter to facilitate the "write one" operation. The diode (D) can be implemented in dual work function polysilicon topologies by selectively doping adjacent regions of the single gate level polysilicon with an appropriate polysilicon doping type and concentration for each transistor type to form a PN junction (16) in the polysilicon (18). A window or opening (20) is formed in the silicide strapping layer (18) to enable the PN junction (16) operation.

3 Claims, 4 Drawing Sheets

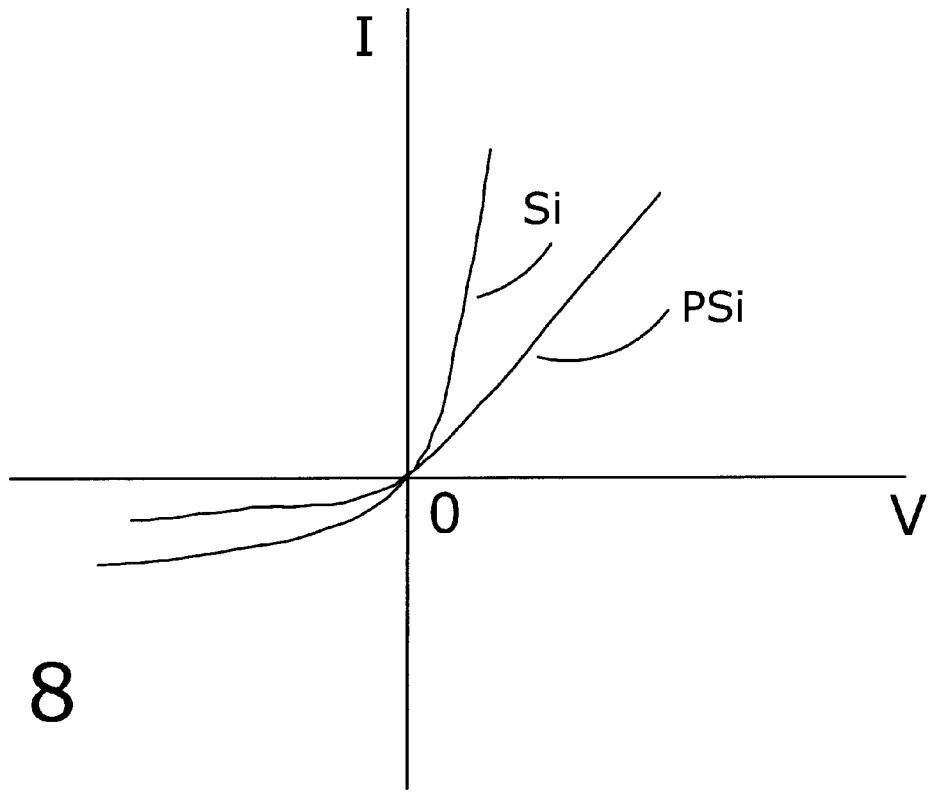
FIG. 8
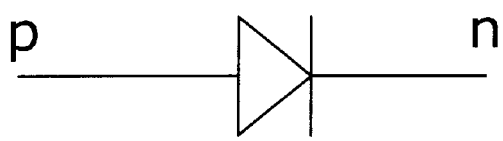

HIGH-PERFORMANCE HIGH-DENSITY CMOS SRAM CELL

CROSS REFERENCE TO RELATED APPLICATIONS

This application claims the benefit of the filing date of U.S. Provisional Patent Application No. 60/220,700, filed Jul. 25, 2000 by the applicant herein and is a continuation in part of U.S. patent application Ser. 09/598,681 filed by the applicant herein on Jun. 21, 2000 now U.S. Pat. No. 6,429,492 issued Aug. 6, 2002.

BACKGROUND OF THE INVENTION

The present invention relates to an improved memory cell organization and, more particularly, to an improved CMOS static RAM cell that provides improvements in functional performance while concurrently allowing higher-density integrated circuits.

In the design and fabrication of integrated circuits, one of the primary design imperatives is to increase functional density by decreasing feature size and packing more circuits closer together. As a consequence of more closely spaced circuit features, parasitic loading with the interconnect grids linking the circuits is commensurately reduced to improve circuit speed. Since power density increases with increased functional density, applied voltages and intra-circuit voltages have been decreased in order to address the heat dissipation problem associated with the increased functional density associated with smaller feature size and increased circuit packing.

The functional throughput rate is a figure of merit having units of gates-hertz per square centimeter. The functional throughput rate is essentially the product of the functional density (in gates per square centimeters) and the maximum circuit frequency (in hertz) and is used as a measure of the progress achieved in advanced microcircuit design and technology. Increased functional density, that is, obtaining the same function within a smaller chip area, is clearly the motivation driving attempts to design circuits to accomplish the same function with fewer transistors.

The present invention is directed to CMOS static RAM and is best appreciated in the context of the six transistor (6T) memory cell configuration of FIG. 1 and the five transistor (5T) configuration of FIG. 2.

FIG. 1 illustrates a standard 6T CMOS static RAM cell defined by MOS transistors TA, TB, TC, TD, TE, and TF; of these transistors, transistors TA and TB are PMOS transistors while the remaining transistors are of the NMOS type. Transistors TA and TC are serially connected between $V_{dd}$ and ground to form a first inverter with a data node 1 between the two transistors, and, in a similar manner, transistors TB and TD are likewise connected between $V_{dd}$ and ground to form a second inverter with a data node 2 therebetween. The gates of transistors of each inverter are connected together and cross-coupled to the data node of the other inverter. The transistor TE is connected between the bit line BL and the data node 1 to provide data access thereto, and the transistor TF is connected between the complementary bit line BLC and the data node 2 to similarly provide data access. The gates of the data access transistors TE and TF are connected to respective word lines WL; ancillary circuitry including differential-input sense amplifiers are not shown in FIG. 1.

The cross-coupled inverters of the 6T memory cell of FIG. 1 have two stable states functioning to store either a binary one or a binary zero. More specifically, the data access transistors TE and TF are gated into conduction by an appropriate voltage applied to the respective word lines while a binary high is impressed on data node 1 via the bit line BL and a binary low is impressed on the complementary bit line BLC. The transistor TD conducts to pull the data node 2 toward ground (binary low) while the data node 1 goes high. The opposite data state can be achieved by reversing the signals applied to the bit lines BL and BLC. The 6T memory cell of FIG. 1 is bi-directionally symmetrical, this is, currents, voltage levels, and time durations are the same for either stable state.

As is know in the art, an increase in functional density can be achieved by eliminating one data access transistor and eliminating the assoicated bit line. As shown in FIG. 2, the data access transistor TF and the bit line BLC have been eliminated to provide a five transistor (5T) configuration. Data to and from the 5T memory cell is controlled by gating the word line WL of the single access transistor TE to the single bit line BL and data node 1.

In contrast to the six transistor cell of FIG. 1 (which typically uses differential input sense amplifiers), the five transistor cell of FIG. 2 uses single-ended sense amplifers to read the status of data node 1. Prior to a data read, the bit line BL is initialized to a pre-determined voltage reference level (i.e., a mid-range voltage $V_{dd}/2$). The data access transistor TE is then turned-on by an appropriate voltage applied to its gate to access the voltage at data node 1 to allow the cell transistors to establish a difference or delta voltage on the bit line DL which is then read by the sense amplifier.

Unlike the six transistor cell of FIG. 1, the five transistor cell of FIG. 2 does not possess symmetry as between writing a binary one and a binary zero to the cell. More specifically, when writing a zero to the memory (that is, writing to the latches when the word line WL is active (i.e., high) and with the bit line BL driven low so that the zero state (data node 1 low and data node 2 high) is stored in the cell).

When effecting a zero write, the data access transistor TE is biased into its highly conductive ohmic or linear-mode (i.e., $V_{gs}-VT>Vds$) so that the conductive data access transistor TE can now sink any current that flows through the transistor TA and thereby drive the voltage at the data node 1 below the switching threshold of the inverter formed by TB and TD thus causing the latch to set in the zero state.

Conversely, when writing a one to the latch (that is, writing the latch when access transistor WL is active (high) and with the bit line BL driven high so that the one state (node 1 high and node 2 low) is stored in the latch) a condition occurs that can hinder driving the data node 1 sufficiently high to cause the desired switching. FIG. 3 is similar to FIG. 2 but shows (in bold line illustration) a voltage divider defined between the bit line BL, the data access transistor TE, the transistor TC, and ground with the data node 1 representing the mid-point of the voltage divider. When writing a one to the memory cell, the access transistor TE is operating in its highly resistive saturation-mode (i.e., $V_{GS}-VT<VDS$) and so the voltage divider formed by the transistor TE (in its saturation-mode) and the transistor TC (in its linear-mode) has difficulties driving the voltage at data node 1 high enough to exceed the switching threshold of the inverter formed by transistors TB and TD to cause the latch to set to the desired one state.

Various techniques have been developed to address this "write one" problem in 5T SRAM cells; each technique also generates specific drawbacks when addressing the "write one" problem including:

(a) bi-level word line clocking schemes have been used for gating the access transistor TE using a boosted word line WL voltage during the write operation so that the access transistor TE always operates in its linear-mode (i.e., in its ohmic or triode region);

(b) asymmetric cell designs that skew the switching thresholds of the inverters forming the latch to facilitate the write-one operation;

(c) multiple device threshold voltages or dynamic device threshold voltages used selectively within the SRAM cell design to enhance the write-one operation; and (d) providing the access device with a significantly wider channel to compensate for the limited channel conductance of its saturation-mode operation.

Each of these options require either a more complicated device process, more complicated device design, or more complicated operational and clocking schemes, or a combination of each of these solutions. The use of a larger-channel access transistor is in a technical direction opposite from the very design precepts that favor the 5T cell design, viz., increased functional density.

SUMMARY OF THE INVENTION

In view of the above, it is an object of the present invention, among others, to provide a high-performance high-density CMOS SRAM cell.

It is another object of the present invention to provide a high-performance high-density CMOS SRAM cell having increased functional and operation density.

It is still another object of the present invention to provide a high-performance high-density 5T CMOS SRAM cell having increased functional and operation density.

In view of these objects, and others, the present invention provides a high-performance high-density CMOS SRAM cell having first and second cross-coupled inverters each defined by serially connected complementary MOS transistors serially connected between $V_{dd}$ and circuit ground to form a first inverter with a first data node between the two transistors, and, in a similar manner, to form a second inverter with a second data node therebetween. The gates of transistors of each inverter are connected together and cross-coupled to the data node of the other inverter. An access transistor is connected between a bit line BL and the first data node to provide data access thereto. A diode is connected between the data node of one of the inverters and the common gate connection of the other inverter to facilitate the "write one" operation. The diode can be implemented in dual work function polysilicon topologies by selectively doping adjacent regions of the single gate level polysilicon with an appropriate polysilicon doping type and concentration for each transistor type to form PN junctions in the polysilicon. A window is formed in the silicide strapping layer to enable the PN junction operation.

The present invention provides a CMOS SRAM cell that provides the same performance as prior designs but with fewer transistors and with a smaller cell size for increased functional density.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 8 is a graphical representation of the I-V characteristics of a silicon diode in comparison with a polysilicon diode.

DESCRIPTION OF THE PREFERRED EMBODIMENT

Figure 3:
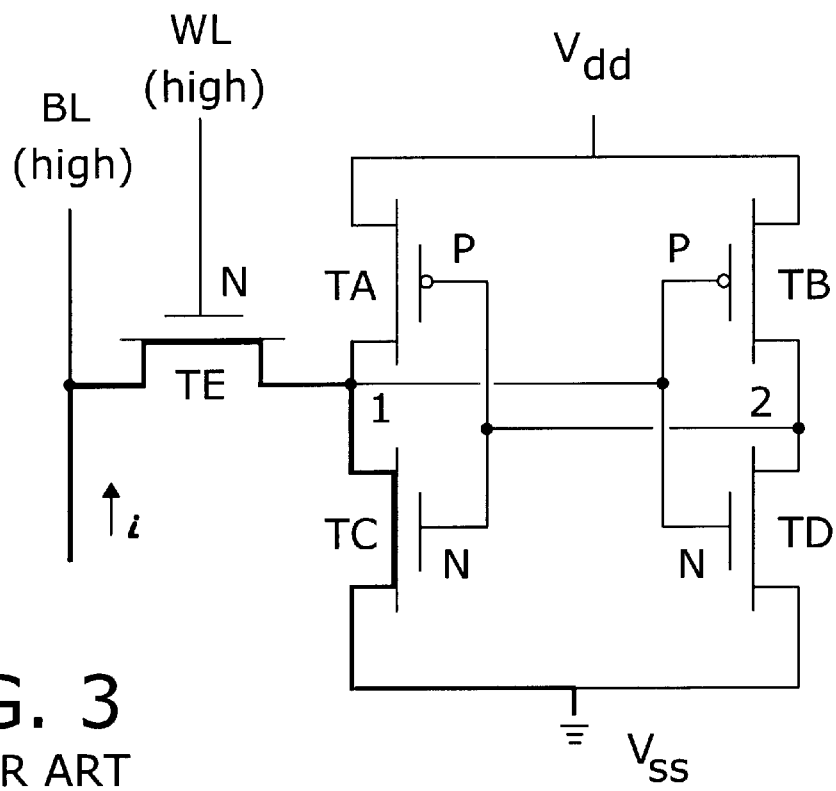
FIG. 3 is a variant of the schematic diagram of FIG. 2 illustrating the presence of a voltage divider path during a "write one" operation.
Figure 4:
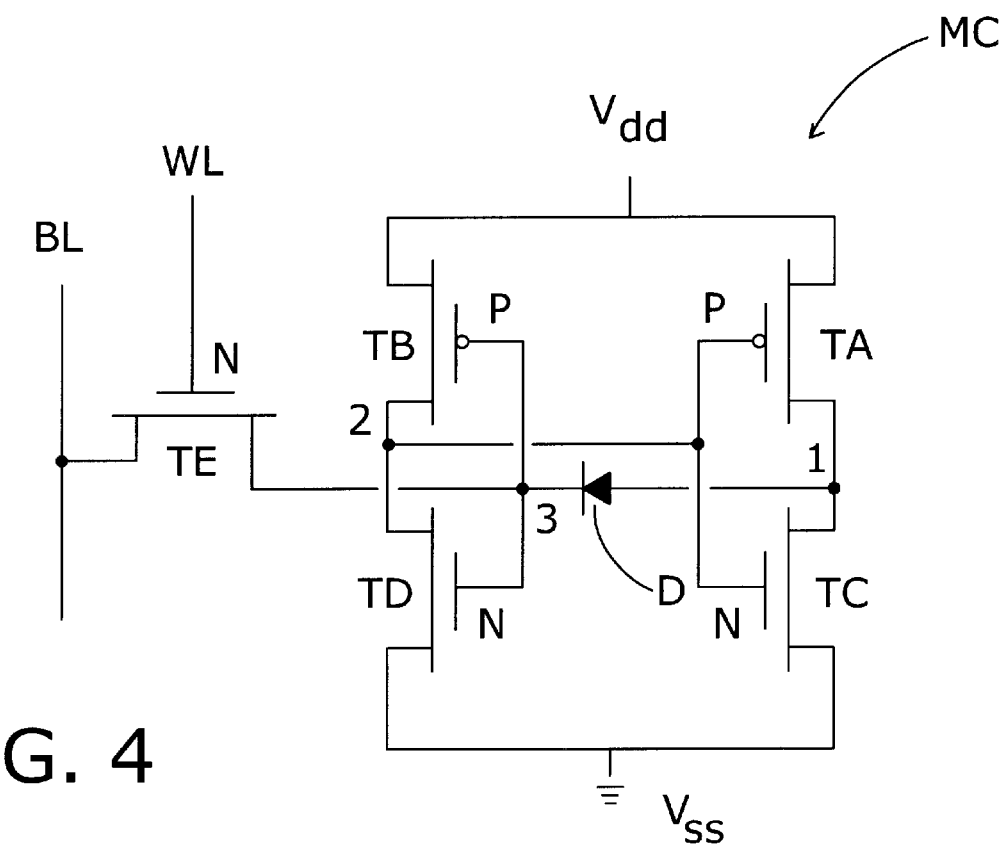
FIG. 4 is a schematic diagram of a five transistor (5T) CMOS static RAM cell in accordance with the present invention.

A high-performance high-density CMOS SRAM cell in accordance with the present invention is shown in FIG. 4 and designated generally therein by the reference character MC. As shown, the basic circuit configuration is the same as that described above in relationship to FIGS. 2 and 3 except that a diode D is connected between the data node of one of the inverters and the common gate connection of the other inverter.

In the preferred embodiment, as described below in relationship to FIGS. 4, 6, and 7, the diode D is a single polysilicon diode that is embedded in the transistor gate polysilicon level.

A "write zero" operation is effected in the same manner as that described above for the 5T memory cells of FIG. 3; that is, the data access transistor TE is operated in its highly conductive linear-mode and the diode D is forward-biased, so the data access transistor TE can easily sink any current that flows through transistor TA and thereby drive the voltage at data node 1 below the switching threshold of the inverter formed by the transistors TB and TD to cause the latch to set in the zero state.

In the "write one" operation, the access transistor TE, even if in its saturation mode, drives data node 3 (at the gates of TB and TD) high because the now reverse-biased diode D is connected in series with transistor TC (operating in its linear mode). Once the voltage at node 3 rises above the switching threshold of the inverter formed by TB and TD, the feedback within the latch causes the cell to set to its one state.

As can be appreciated from the above, the diode D allows all read and write operations to be accomplished without any special considerations.

Figure 1:
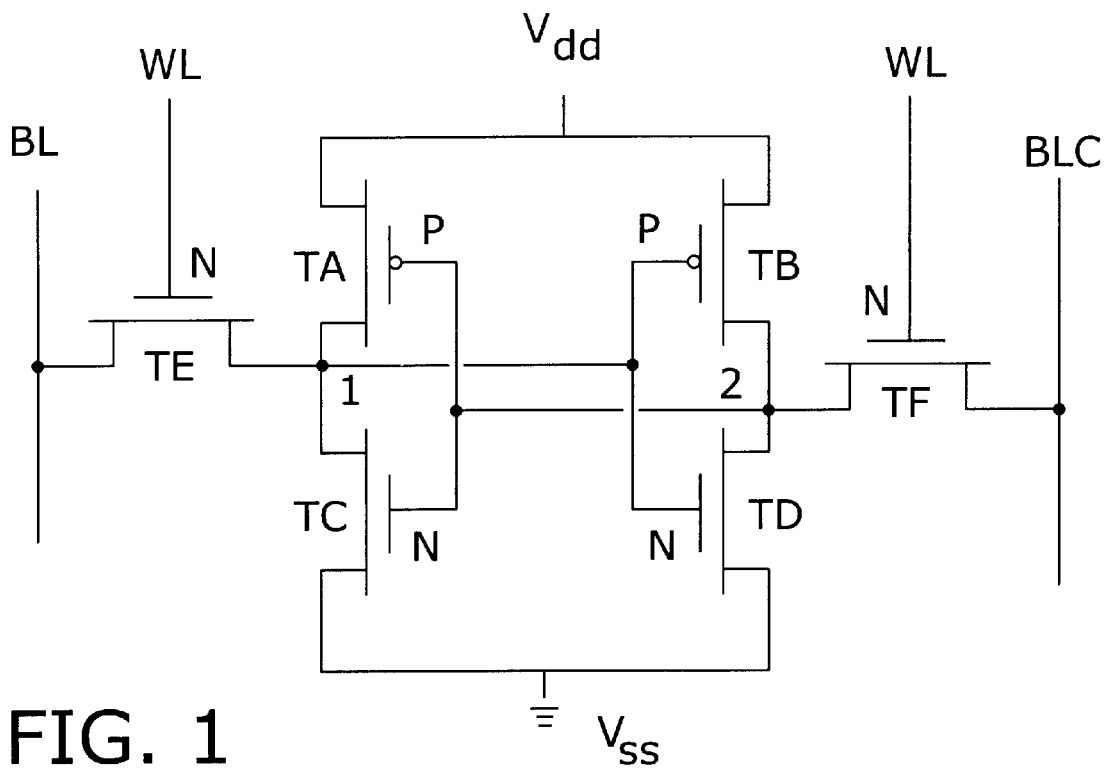
FIG. 1 is a schematic diagram of a known six transistor (6T) CMOS static RAM cell.
Figure 2:
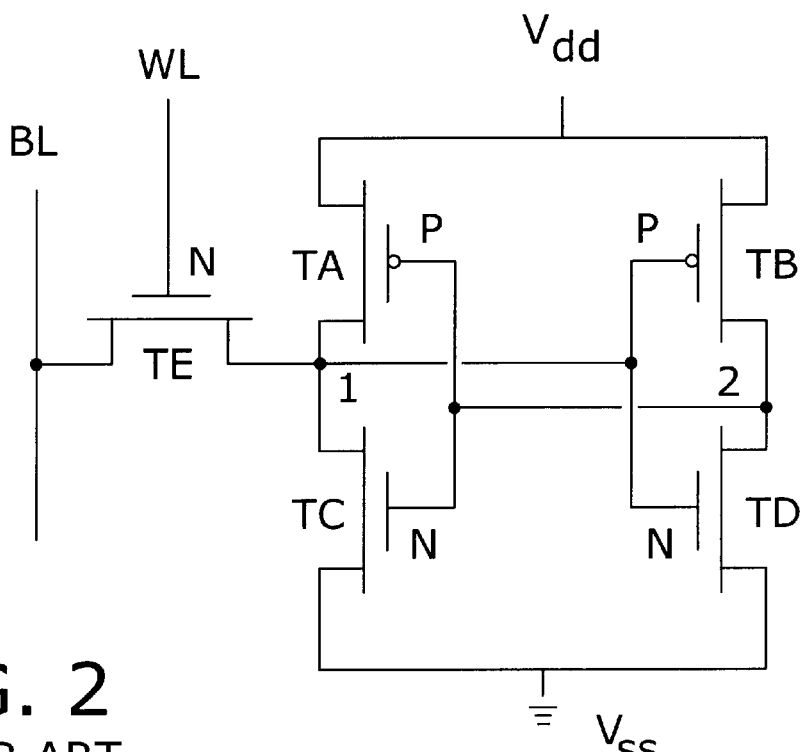
FIG. 2 is a schematic diagram of a known five transistor (5T) CMOS static RAM cell.

The five transistors and the diode D are connected as shown in FIG. 4 to provide fast, efficient full read and full write operations without the need for any of the special processes, design considerations, or operational considerations that were required for the conventional five-transistor cell design described in relationship to FIGS. 1, 2, and 3. Increased functional density is realized in contrast to standard six-transistor cells of FIG. 1, and the conventional five-transistor cells of FIG. 2, since the access transistor TE does not need to be enlarged to ensure proper operation, and the diode D, as explained below, is embedded in pre-existing polysilicon line segments.

Figure 5:
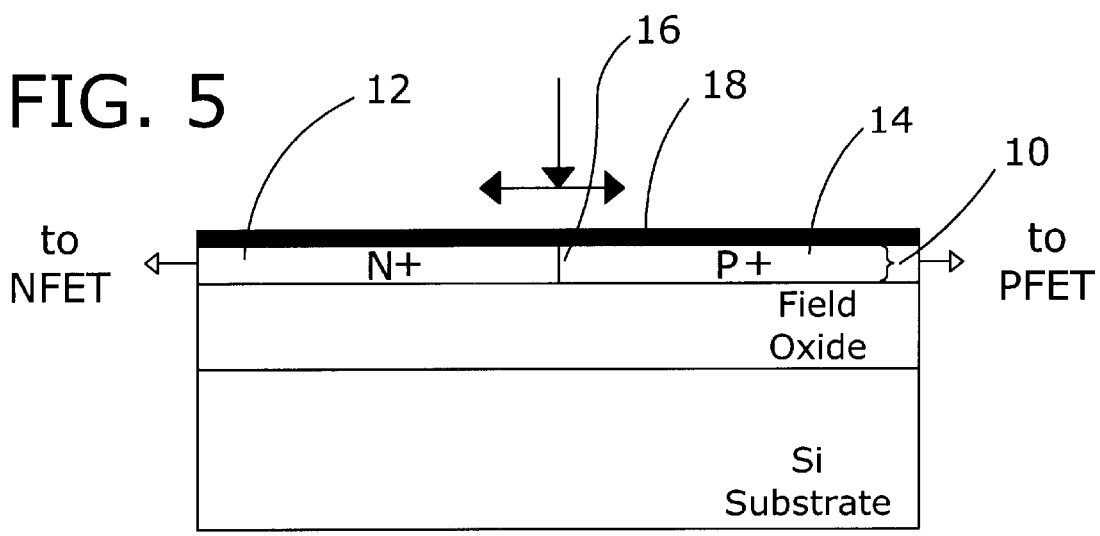
FIG. 5 illustrates, in cross-section, a dual work function polysilicon area of a CMOS static RAM cell of known topology.

The present invention can be implemented with particular efficacy in those CMOS technologies that use dual work function polysilicon gate electrodes, viz., a single polysilicon level in which an n-type polysilicon is used to form the gate electrode for the nFETs and in which a p-type polysilicon is used to form the gate electrode for the pFETs. As represented in schematic fashion in FIG. 5 and as explained in more detail below, dual work function polysilicon is achieved by selectively doping adjacent regions of the single gate level polysilicon with an appropriate polysilicon doping type and concentration for each transistor type. Consequently, PN junctions are formed in the polysilicon at the boundaries of these two contiguous doping regions. Since the gate electrode must be highly conductive, a silicide layer straps the PN functions, as illustrated in FIG. 5, to effectively shunt the polysilicon PN junctions and circumvent any impact these PN junction diodes would have had on the electrical response of the circuit. The I-V characteristic of the silicide strapped polysilicon PN junction is completely linear (i.e., a low resistive ohmic characteristic) with no rectification.

FIG. 5. illustrates, in cross-section, a portion of the gate level polysilicon doping pattern for the SRAM cell design; the various cell transistors are not shown in FIG. 5. The cell transistors have a standard, conventional structure and are made in a standard integrated circuit fashion. The dual work function polysilicon provides n-type polysilicon gate electrodes for the n-channel MOSFETs and p-type polysilicon gate electrodes for the p-channel MOSFETS. As shown in FIG. 5, a polysilicon layer 10 includes a N+ region 12 and a P+ region 14 defining a PN junction 16 therebetween. Polysilicon with one N+ and one P+ region, as shown in FIG. 5, is known as dual work function polysilicon. The N+ region 12 and P+ region 14 are formed as a result of ion implantation into the polysilicon layer 10 during formation of the N+ and P+ diffusions that form the source and drain regions of transistors in the silicon substrate. In general, the process includes depositing undoped polysilicon over a semiconductor substrate and patterning and etching the polysilicon over underlying features including, for example, transistor and/or other device regions, wiring regions, and thin and thick oxide regions. The patterning and etching of the polysilicon forms the polysilicon portion of devices, such as transistor gates, and polysilicon interconnects. After the polysilicon is patterned, N+ and P+ ion implantation steps are performed one at a time with an annealing step performed subsequent to the ion implantation step. Typically, these steps include forming oxide and photoresist masking layers followed by patterning and exposing masking regions to receive n-type or p-type doping, the dopant type dependent upon the step being performed. The n-type or p-type implant is generally made through the exposed regions in the masking layers.

After the polysilicon is patterned and doped as described above, a silicide layer 18, for example, a titanium silicide, is selectively formed on the polysilicon and other desired areas of the semiconductor. Silicide formation may be effected by forming oxide and photoresist masking layers to selectively expose and block portions of the polysilicon and other regions of the semiconductor. The photoresist may then be stripped, followed by depositing a layer of refractory metal commonly used in the formation of silicides, such as titanium. The titanium is then annealed to alloy the metal and the polysilicon to form a silicide layer onto selective portions of the polysilicon layer.

The silicide layer increases the electrical conductivity of the underlying polysilicon and the source/drain regions, as is known in the art.

As a result of ion implantation, the polysilicon layer 10 has a N+ doping over N-MOSFET devices and, similarly, the polysilicon layer 10 has a P+ doping over P-MOSFET devices. In the wiring region between N and P MOSFETS, the polysilicon layer 10 has a single boundary between adjoining regions that are exposed to one of N-type or the P-type doping. Therefore, conventionally, one PN junction 16 is formed between adjoining N-MOSFET and P-MOSFET devices.

In order to avoid rectification at the PN junction 16, the silicide layer 18 is conventionally formed over the polysilicon layer 10. Since the conductive silicide layer 18 is formed over the N+ region 12 and P+ region 14, current flows between each of the regions 12 and 14 of the polysilicon layer 10 and the conductive silicide 18 thus effectively short-circuiting or shunting the PN junction 16 and eliminating the effects of the PN junction 16 on current carried along the layer 18 and the underlying layer 10. Thus, in conventional processing, the PN junction 16 of FIG. 5 is functionally negated by the conductive silicide layer 18 formed over the dual work function polysilicon layer 10.

Figure 6:
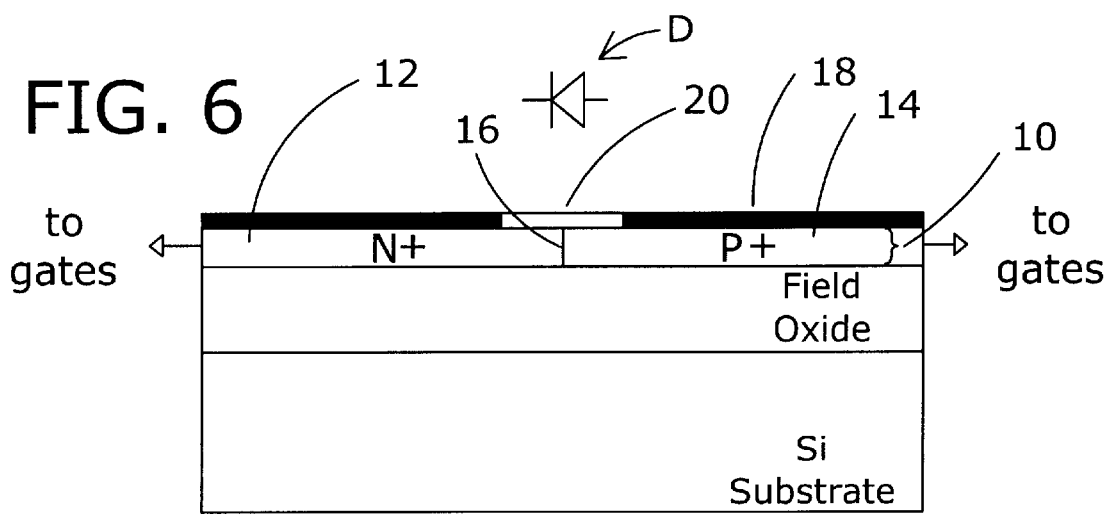
FIG. 6 illustrates, in cross-section, a dual work function polysilicon area of the CMOS static RAM cell of FIG. 4 in which a selected portion of the overlying conductive silicide has been removed in accordance with the present invention.
Figure 7:
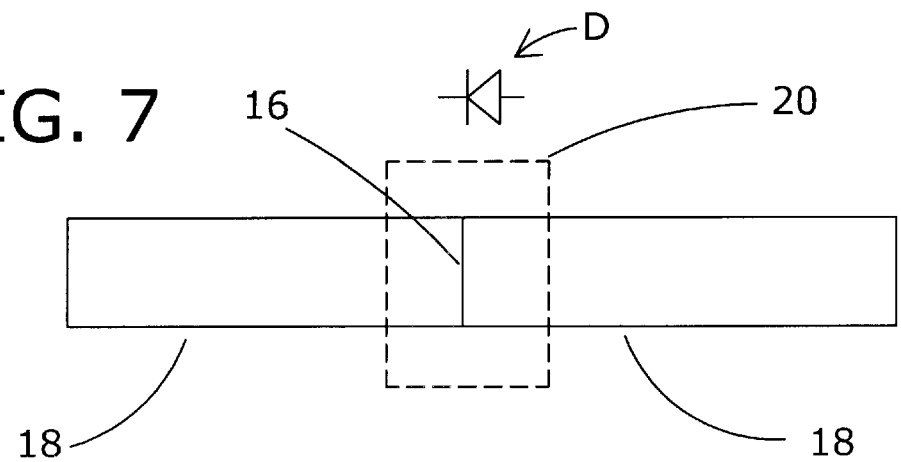
FIG. 7 is a partial top view of FIG. 6 showing a opened portion of the overlying conductive silicide layer to reveal a PN junction.

In accordance with the preferred embodiment and as shown in FIG. 6, the contiguous P and N doped regions of the dual work function polysilicon level 10 are rendered operable by not shunting the n and p doping regions, 12 and 14, in the immediate area of the polysilicon PN junction diode 16. As shown in FIG. 7, a window or opening 20 is formed in the overlying silicide layer 18 and the immediate vicinity of the PN junction 16 and is of an area and configuration to cause or allow the PN junction 16 to function as the diode D as described above in relationship to FIG. 4.

Thus, the absence of short-circuiting or shunting silicide in the immediate area of region of the polysilicon PN junction 16 thus provides a fully functional PN junction corresponding to the diode D shown in FIG. 4.

As is known, PN junction diodes formed in polycrystalline silicon have different characteristics than PN junction diodes formed in single crystalline silicon; these difference being a function of the granular morphology of the polysilicon, granular orientation or organization, and the relative quanta of grain boundaries in the material. As shown by the plot PSi in FIG. 8, the I-V characteristic of the polysilicon junction is such that the polysilicon diode has a lower forward-bias conductance and higher reverse-bias leakage than conventional a single crystalline silicon diode (plot Si). However, the basic diode function is evident in polysilicon diodes, that is, a significantly higher anode-to-cathode conductance when the diode is forward biased (i.e., when the anode is at a higher potential than the cathode) than when the diode is reverse-biased (i.e., when the cathode is at a higher potential than the anode).

The embodiment of FIG. 4 is illustrative; an equivalent memory cell can be implemented by replacing the NFET access transistor (gated with an active high WL) with a PFET access transistor (gated by an active low WL) and reversing the polarity of the diode D.

The present invention provides an improvement in SRAM cell topology by providing an efficient solution to the write one issue discussed above while also improving circuit and functional density. Compared to the cell area used by the standard six-transistor cell, the present invention eliminates an access transistor, one bit line, and the associated contact and vias resulting in an estimated up-to-20% reduction is cell area while offering essentially the same performance. Compared to conventional five-transistor cell designs, the present invention is much smaller, faster, requires no special process, design, or operational considerations, and consequently is much easier to implement.

As will be apparent to those skilled in the art, various changes and modifications may be made to the illustrated high-performance high-density CMOS SRAM cell of the present invention without departing from the spirit and scope of the invention as determined in the appended claims and their legal equivalent.

What is claimed is:

1. A 5T CMOS static RAM cell of the type in which a one state or a zero state is written thereto from a single bit line, comprising:

a first inverter define by serially connected complementary MOS transistors (TA/TC) serially connected between a voltage source and a circuit ground and forming a first data node (1) between the transistors (TA/TC);

a second inverter defined by serially connected complementary MOS transistors (TB/TD) serially connected between the voltage source and the circuit ground and forming a second data node (2) between the transistors (TB/TD);

the gates of the transistors (JA/TC) of the first inverter connected and to the second node (2);

the gates of the transistors (TB/TD) of the second inverter connected together and to a bit line (BL) through an access transistor (TE); and a PN diode connected between the first data node (1) and the connected together gate of the transistors (TB/TD) of the second inverter, the diode being reversed biased during a write one operation.

2. The CMOS static RAM cell of claim 1, wherein the gates are implemented in a dual work function polysilicon layer (10) having a PN junction (16) formed therein and an adjacent conductive layer (18), the diode (D) defined by a window or opening (20) formed in the conductive layer (18).

3. The CMOS static RAM cell of claim 2, wherein said dual work function polysilicon (10) is a single polysilicon layer having first and second adjacent regions (12,14) of opposite conductivity type that define said PN junction (16), the window or opening (20) of sufficient area and configuration in said conductive layer (18) to allow PN junction functionality between the first and second adjacent regions of opposite conductivity type.

\* \* \* \* \*

UNITED STATES PATENT AND TRADEMARK OFFICE
CERTIFICATE OF CORRECTION

| | |
|---|---|
| PATENT NO. | : 6,570,227 B2 |
| APPLICATION NO. | : 09/911872 |
| DATED | : May 27, 2003 |
| INVENTOR(S) | : Rockett |

It is certified that error appears in the above-identified patent and that said Letters Patent is hereby corrected as shown below:

Title page, item (73), under "Assignee", in Column 1, Line 2, delete "Electronics" and insert -- Electronic --.

On the title page, in item (63), delete "Continuation-in-part of application No. 09/598,681, filed on Jun. 21, 2000, now Pat. No. 6,429,492" and insert therefor -- Continuation-in-part of application No. 09/598,681, filed on Jun. 21, 2000, which claims priority from Provisional Patent Application No. 60/140,361 filed Jun. 23, 1999 and U.S. Provisional Patent Application No. 60/164,343 filed Nov. 9, 1999, now Pat. No. 6,429,492 --.

Column 7, line 17, in Claim 1, delete "define by" and insert -- defined by --.

Column 8, line 1, in Claim 1, delete "transistors (JA/TC)" and insert -- transistors (TA/TC) --.

Column 8, line 2, in Claim 1, delete "connected and" and insert -- connected together and --.

Column 8, line 8, in Claim 1, delete "together gate of" and insert -- together gates of --.

Column 8, line 9, in Claim 1, delete "reversed biased" and insert -- reversed-biased --.

Signed and Sealed this
First Day of May, 2012

David J. Kappos
*Director of the United States Patent and Trademark Office*